United States Patent
Kim et al.

(10) Patent No.: US 6,917,508 B2
(45) Date of Patent: Jul. 12, 2005

(54) APPARATUS FOR MANUFACTURING SEMICONDUCTOR DEVICE

(75) Inventors: Joung-Sik Kim, Seocheon-gun (KR); Bu-Jin Ko, Joong-gu (KR)

(73) Assignee: Jusung Engineering Co., Ltd. (KR)

( * ) Notice: Subject to any disclaimer, the term of this patent is extended or adjusted under 35 U.S.C. 154(b) by 246 days.

(21) Appl. No.: 10/443,304

(22) Filed: May 22, 2003

(65) Prior Publication Data

US 2004/0003898 A1 Jan. 8, 2004

(30) Foreign Application Priority Data

May 24, 2002 (KR) .............................. 10-2002-0028948

(51) Int. Cl.[7] .............................................. C23C 16/00
(52) U.S. Cl. .................. 361/234; 156/345.47; 279/128
(58) Field of Search ..................... 156/345.47, 345.51, 156/345.52, 345.53, 345.54; 118/723 E, 728, 725, 724; 279/128; 361/234

(56) References Cited

U.S. PATENT DOCUMENTS 5,810,933 A    9/1998  Mountsier
6,606,234 B1 * 8/2003  Divakar ...................... 361/234

FOREIGN PATENT DOCUMENTS

| JP | 09-289201 | 11/1997 |
| KR | 1999-0085680 | 12/1999 |

* cited by examiner

*Primary Examiner*—P. Hassanzadel
*Assistant Examiner*—Sylvia R. MacArthur
(74) *Attorney, Agent, or Firm*—Baker & Daniels LLP

(57) ABSTRACT

An apparatus for manufacturing a semiconductor device includes a chamber, upper and lower electrodes spacing apart and facing each other in the chamber, the upper and lower electrodes supplied with high frequency power to form plasma, an electrostatic chuck on the lower electrode and settling a substrate thereon, a chuck base between the electrostatic chuck and the lower electrode, and protecting the electrostatic chuck, and a helium line supplying helium gas to a gap between the substrate and the electrostatic chuck, the helium line filled with a plurality of fine insulating balls.

4 Claims, 5 Drawing Sheets

APPARATUS FOR MANUFACTURING SEMICONDUCTOR DEVICE

The present invention claims the benefit of Korean Patent Application No. 2002-28948, filed in Korea on May 24, 2002, which is hereby incorporated by reference for all purposes as if fully set forth herein.

BACKGROUND OF THE INVENTION

1. Field of the Invention

The present invention relates to an apparatus for manufacturing a semiconductor device and more particularly, to an apparatus using plasma.

2. Discussion of the Related Art

Due to a development in the semiconductor industry, a semiconductor device has pursuit high capacity and various functions, and it is required to integrate more circuits in limited region. Thus, technique for treating wafers has been researched and developed to make patterns extremely fined and highly integrated. To realize such a semiconductor device, methods using plasma has been widely used in processes for manufacturing the semiconductor device, such as depositing and etching of a thin film.

The apparatus using plasma will be explained with reference to attached drawings.

FIG. 1A is a schematic view of showing an apparatus for manufacturing a semiconductor device in the related art, and FIG. 1B is an enlarged view of the portion "A" of FIG. 1A. The portion "A" corresponds to where one end of a helium line is inserted into fixed parts of a lower electrode and a chuck base.

In FIGS. 1A and 1B, the apparatus includes a chamber 10 and an upper electrode 20, a lower electrode 30, a chuck base 40 and an electrostatic chuck 50 therein. The upper electrode 20 and the lower electrode 30 are spaced apart at upper and lower parts of the chamber 10 and facing each other. The upper electrode 20 and the lower electrode 30 are supplied with matched high frequency power, for example, radio frequency (RF) power, from the outside, and form plasma in the chamber 10. The electrostatic chuck 50 is disposed on the lower electrode 30, and settles a wafer W by electrostatic force. Here, the chuck base 40, which is interposed between the electrostatic chuck 50 and the lower electrode 30, protects and supports the electrostatic chuck 50. Moreover, the chuck base 40 provides high frequency power and generates static electricity. An insert 61 at one end of a helium line 60 is put in and passing through fixed parts of the lower electrode 30 and the chuck base 40 to supply an insert gas, such as helium (He) gas, into a gap between the wafer W and the electrostatic chuck 50. At this time, the insert 61 is disposed so that the helium gas might be provided into an injection hole of the electrostatic chuck 50.

The helium gas, which functions as an intermediary, disperses heat transmission between the lower electrode 30 and the wafer W, and properly maintains the temperature of the wafer W by cooling while a process for the wafer W, such as depositing and etching, is going on. The helium gas is injected through the helium line 60 from a helium gas source part (not shown) of the outside.

Thus, when the process is going on, matched high frequency power is applied to the upper electrode 20 and the lower electrode 30, thereby forming plasma. At this time, high frequency power of direct current is applied to the electrostatic chuck 50, and static electricity is generated. Simultaneously, electric field of a vertical direction in the context of the figure is formed in the helium line 60 for supplying helium gas by the electrostatic chuck 50 and the chuck base 40 supporting the electrostatic chuck. 50. Therefore, at a part of the chuck base 40, where one end of the helium line 60 is inserted, arc helium plasma may be formed. The arc helium plasma causes unstable matching of high frequency power at the upper and lower electrodes, static electricity and direct current voltage, and the wafer W may float. Like this, the arc helium plasma has evil effects on the process.

To solve the problem, a ceramic of an insulator has been used as the insert of the helium line.

FIGS. 2A and 2B schematically show another helium line according to the related art. In FIGS. 2A and 2B, to prevent plasma around the insert of the helium line, the insert 61 may be made of a ceramic, and the insert 61 may include a plurality of fine tubes as shown in FIG. 2A or a bended fine tube as shown in FIG. 2B. However, fine particles are still attached to the treated surface of the ceramic insert, and thus the surface of the wafer may be damaged. In addition, processing the ceramic insert is so hard that manufacturing costs may increase.

SUMMARY OF THE INVENTION

Accordingly, the present invention is directed to an apparatus for manufacturing a semiconductor device that substantially obviates one or more of problems due to limitations and disadvantages of the related art.

An advantage of the present invention is to provide an apparatus for manufacturing a semiconductor device that prevents undesirable plasma and improves reliability of the semiconductor device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an apparatus for manufacturing a semiconductor device includes a chamber, upper and lower electrodes spacing apart and facing each other in the chamber, the upper and lower electrodes supplied with high frequency power to form plasma, an electrostatic chuck on the lower electrode and settling a substrate thereon, a chuck base between the electrostatic chuck and the lower electrode, and protecting the electrostatic chuck, and a helium line supplying helium gas to a gap between the substrate and the electrostatic chuck, the helium line filled with a plurality of fine insulating balls It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the illustrated embodiment of the present invention, which is illustrated in the accompanying drawings. Wherever possible, the same reference numbers will be used throughout the drawings to refer to the same or like parts.

Figure 1A:
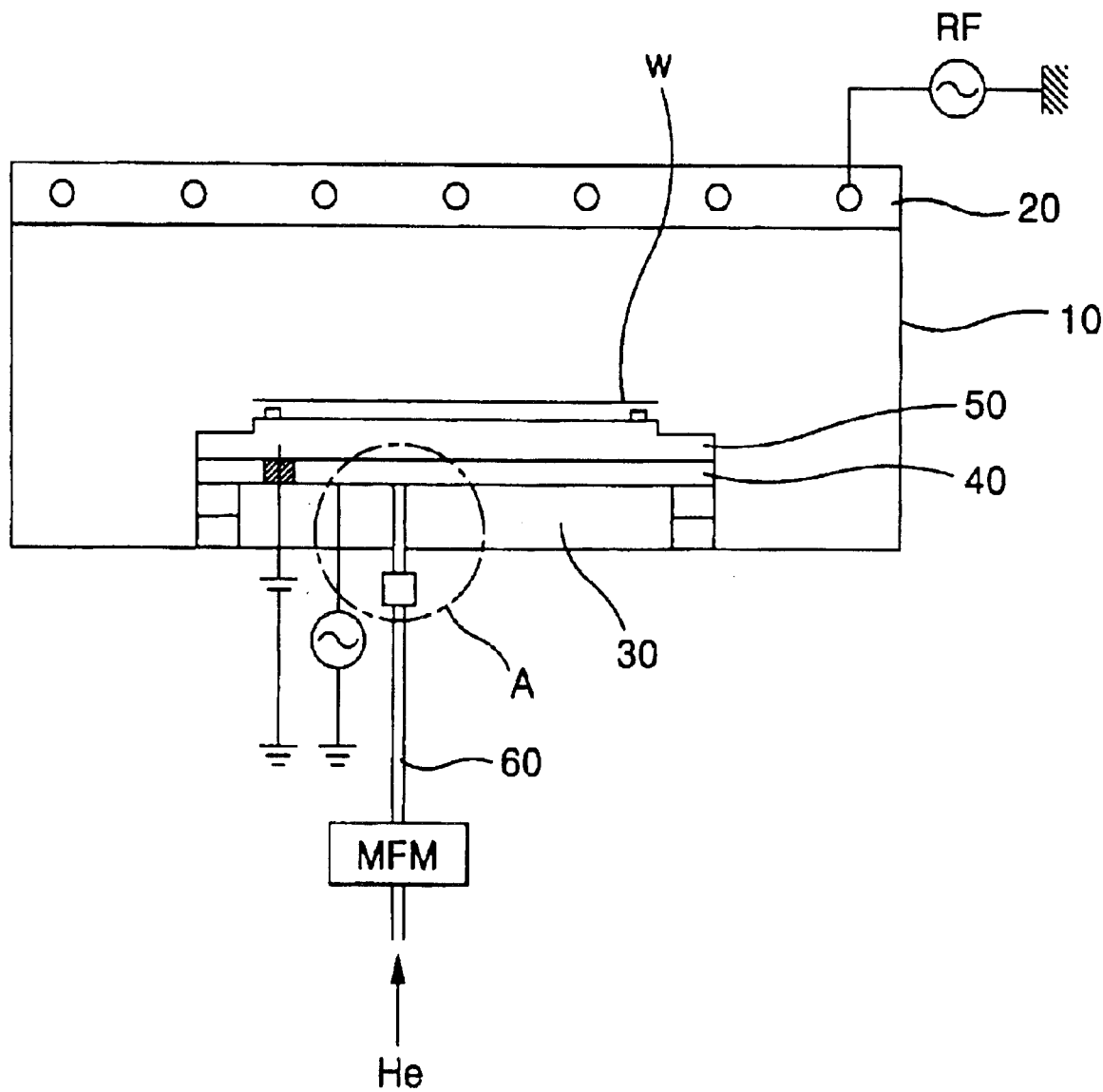
FIG. 1A is a schematic view of showing an apparatus for manufacturing a semiconductor device in the related art.
Figure 1B:
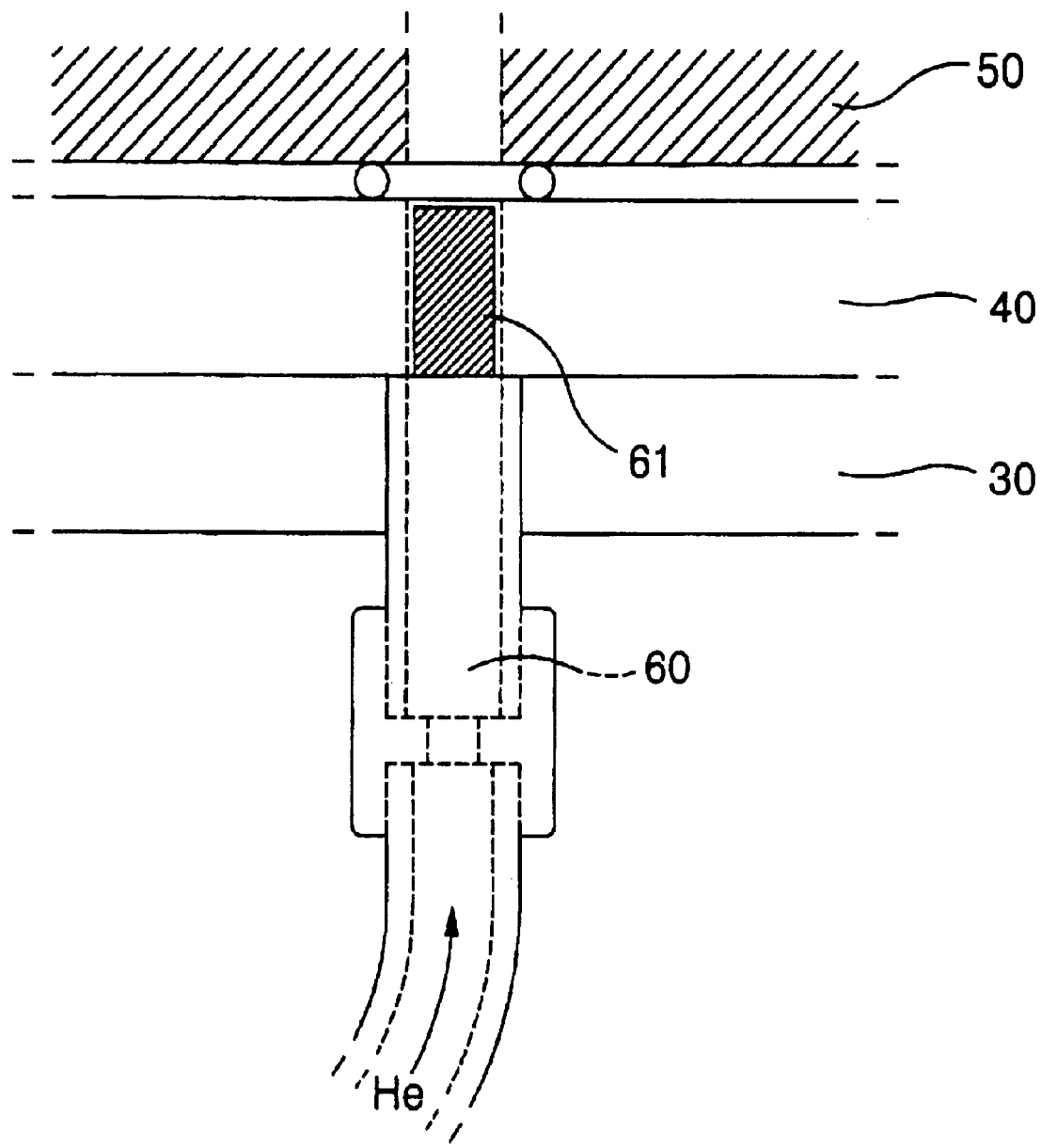
FIG. 1B is an enlarged view of the portion "A" of FIG. 1A.
Figure 2A:
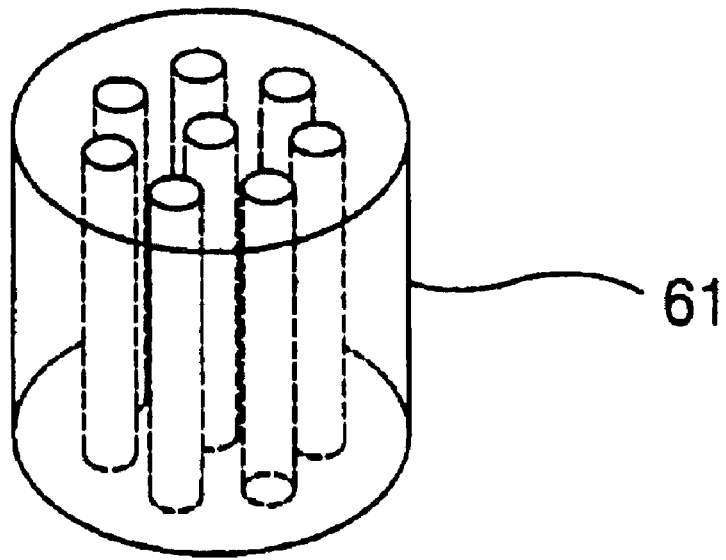
FIGS. 2A and 2B are schematic views showing another helium line according to the related art.
Figure 2B:
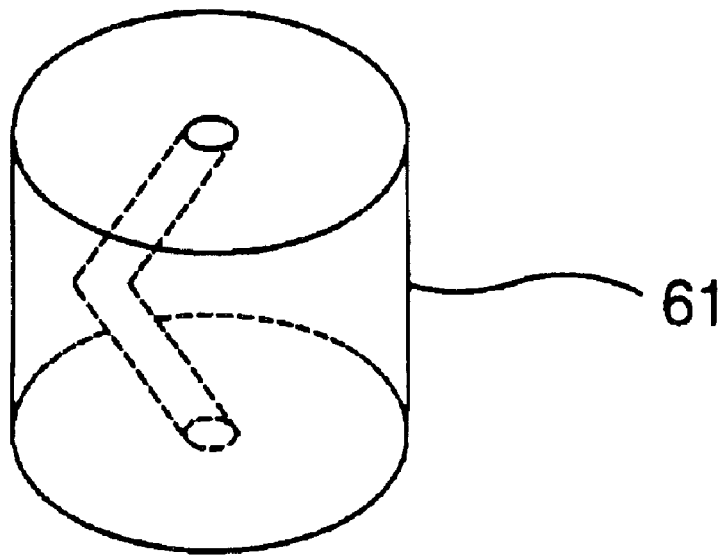
Figure 3A:
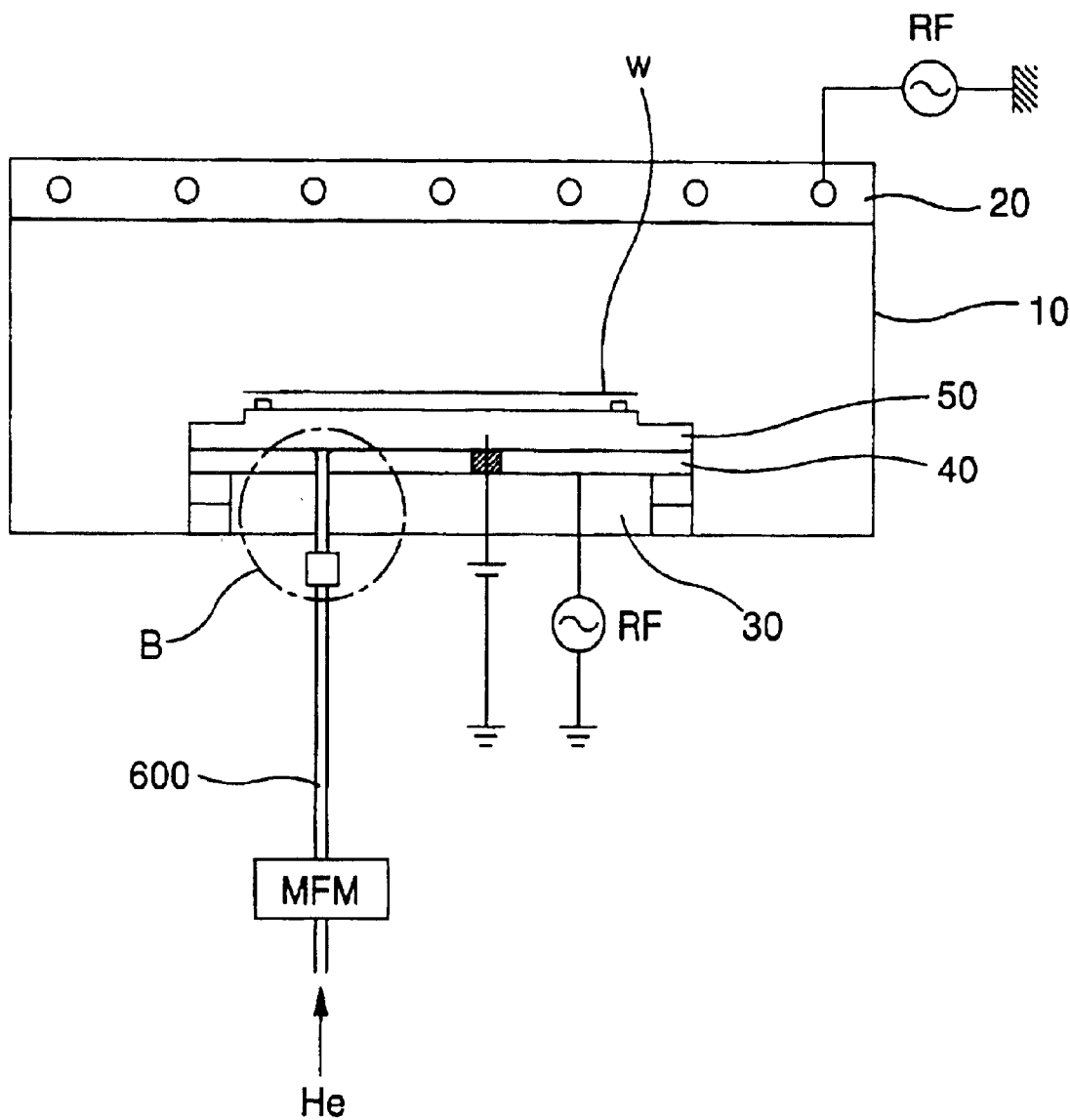
FIG. 3A is a schematic view of showing an apparatus for manufacturing a semiconductor device according to an embodiment of the present invention.
Figure 3B:
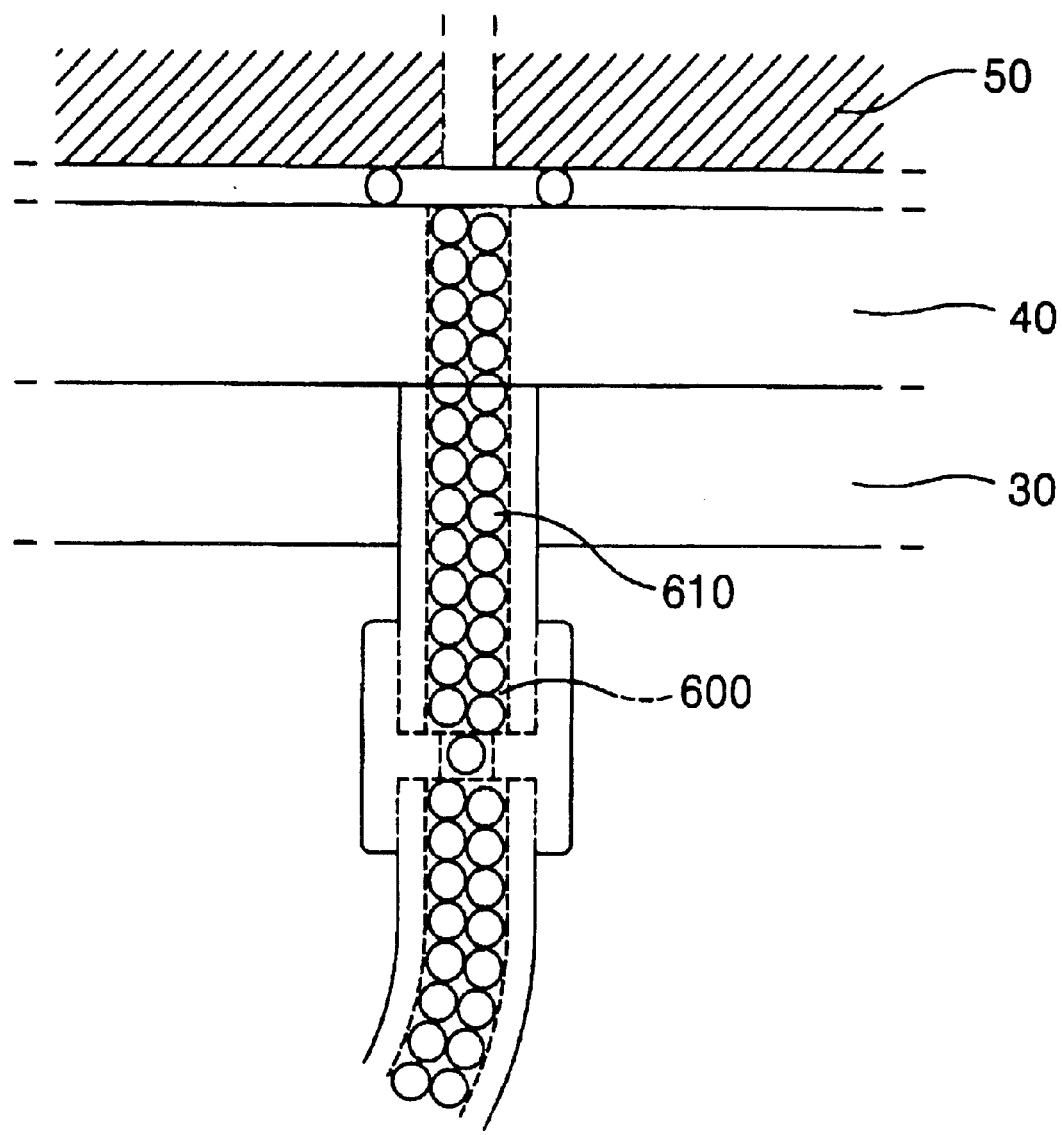
FIG. 3B is an enlarged view of the portion "B" of FIG. 3A.

FIG. 3A is a schematic view of showing an apparatus for manufacturing a semiconductor device according to an embodiment of the present invention, and FIG. 3B is an enlarged view of the portion "B" of FIG. 3A. The portion "B" corresponds to where one end of a helium line is inserted into fixed parts of a lower electrode and a chuck base. In the apparatus, a thin film may be deposited or etched by using plasma.

In FIGS. 3A and 3B, the apparatus includes a chamber 10 and an upper electrode 20, a lower electrode 30, a chuck base 40 and an electrostatic chuck 50 therein. Although not shown, the chamber 10 also includes a gas inlet for supplying source gases into the chamber 10 and an outlet for exhausting the air in the chamber 10. The upper electrode 20 and the lower electrode 30 are spaced apart at upper and lower parts of the chamber 10 and facing each other. The upper electrode 20 and the lower electrode 30 are supplied with matched high frequency power, i.e., radio frequency (RF) power, from the outside, and form plasma in the chamber 10. On the lower electrode 30, the electrostatic chuck 50 is disposed to settle a substrate, for example a wafer W, by electrostatic force. In addition, the chuck base 40 interposed between the electrostatic chuck 50 and the lower electrode 30 protects and supports the electrostatic chuck 50.

One end of a helium line 600 is put in and passing through fixed parts of the lower electrode 30 and the chuck base 40 to supply insert gas, such as helium (He) gas, into a gap between the wafer W and the electrostatic chuck 50. At this time, the end of the helium line 600 corresponds to an injection hole of the electrostatic chuck 50 so that helium gas may be injected in the electrostatic chuck 50.

The helium line 600 is filled with a plurality of fine ceramic balls 610 to the end inserted into the lower electrode 30 and the chuck base 40.

In the apparatus of the present invention including the helium line 600 filled with the fine ceramic balls 610, when the process for the wafer W such as depositing or etching is going on, high frequency power from the outside is applied to the upper and lower electrodes 20 and 30, and plasma is formed. At this time, electric field is induced in the chuck base 40 due to the high frequency power, but the helium line 600 is not affected by the electric field because the fine ceramic balls 610 in the helium line 600 are not influenced by electric field. Additionally, are helium plasma is not formed around the end of the helium line 600, and there is no damage of the wafer W due to fine particles that may be produced by arc discharge. Therefore, stable plasma process may progress.

Here, the fine ceramic balls 610 may have a uniform size or various sizes.

It will be apparent to those skilled in the art that various modifications and variation can be made in the fabrication and application of the present invention without departing from the spirit or scope of the invention Thus, it is intended that the present invention cover the modifications and variations of this invention provided they come within the scope of the appended claims and their equivalents.

What is claimed is:

1. An apparatus for manufacturing a semiconductor device, comprising:

a chamber;

upper and lower electrodes spacing apart and facing each other in the chamber, the upper and lower electrodes supplied with high frequency power to form plasma;

an electrostatic chuck on the lower electrode and settling a substrate thereon;

a chuck base between the electrostatic chuck and the lower electrode, and protecting the electrostatic chuck; and a helium line supplying helium gas to a gap between the substrate and the electrostatic chuck, the helium line filled with a plurality of fine insulating balls.

2. The apparatus according to claim 1, wherein the plurality of fine insulating balls is made of a ceramic.

3. The apparatus according to claim 1, wherein the plurality of fine insulating balls has the same size.

4. The susceptor according to claim 1, wherein the plurality of fine insulating balls has various sizes.

* * * * *

UNITED STATES PATENT AND TRADEMARK OFFICE
CERTIFICATE OF CORRECTION

PATENT NO. : 6,917,508 B2
DATED : July 12, 2005
INVENTOR(S) : Joung-Sik Kim et al.

It is certified that error appears in the above-identified patent and that said Letters Patent is hereby corrected as shown below:

<u>Column 4,</u>
Line 13, after the words "by electric field. Additionally," delete "are" and correct it to read -- arc --.

Signed and Sealed this

Thirtieth Day of August, 2005

JON W. DUDAS
*Director of the United States Patent and Trademark Office*